(12) United States Patent
Matteis

(10) Patent No.: US 12,326,482 B2
(45) Date of Patent: Jun. 10, 2025

(54) MAGNETIC SYSTEM FOR COUNTING ROTATIONS HAVING INCREASED STABILITY AGAINST MAGNETIC INTERFERENCE FIELDS

(71) Applicants: Leibniz-Institut Fuer Photonische Technologien E.V., Jena (DE); Horst Siedle GmbH & Co. KG, Furtwangen (DE)

(72) Inventor: Roland Matteis, Jena (DE)

(73) Assignees: Horst Siedle GmbH & Co. KG, Furtwangen (DE); Leibniz-Institut Fuer Photonische Technologien e.V., Jena (DE)

( * ) Notice: Subject to any disclaimer, the term of this patent is extended or adjusted under 35 U.S.C. 154(b) by 139 days.

(21) Appl. No.: 18/032,522

(22) PCT Filed: Nov. 2, 2021

(86) PCT No.: PCT/DE2021/000185
§ 371 (c)(1),
(2) Date: Apr. 18, 2023

(87) PCT Pub. No.: WO2022/096050
PCT Pub. Date: May 12, 2022

(65) Prior Publication Data
US 2023/0384399 A1 Nov. 30, 2023

(30) Foreign Application Priority Data
Nov. 9, 2020 (DE) .................... 10 2020 006 987.8

(51) Int. Cl.
*G01R 33/00* (2006.01)
*G01D 5/14* (2006.01)
*G01R 33/09* (2006.01)

(52) U.S. Cl.
CPC ......... *G01R 33/0005* (2013.01); *G01D 5/145* (2013.01); *G01R 33/093* (2013.01); *G01R 33/098* (2013.01); *G01D 2205/20* (2021.05)

(58) Field of Classification Search
CPC ............. G01R 33/0005; G01R 33/093; G01R 33/098; G01D 5/145; G01D 2205/20
See application file for complete search history.

(56) References Cited

U.S. PATENT DOCUMENTS 9,859,332 B2 * 1/2018 Theuss ............... G01R 33/0005
10,228,267 B2 3/2019 Mattheis et al.
(Continued)

FOREIGN PATENT DOCUMENTS

DE 10 2008 053 226 A1 7/2010
EP 3 066 421 B1 1/2018
(Continued)

*Primary Examiner* — Reena Aurora
(74) *Attorney, Agent, or Firm* — Norris Mclaughlin, P.A.

(57) ABSTRACT

A magnetic system for counting revolutions is provided having increased immunity to magnetic interference fields and which can be used in a magnetic field range (B-field range) that is considerably above that customarily used according to the prior art, with the width of the magnetic window ΔB, which is to say the difference between the lower and upper B-values permissible during use, being as large as possible, an angle sensor for determining the field direction of a magnetic field of a permanent magnet which jointly captures the angle sensor and a revolution counter with the revolution counter being formed by a GMR or TMR revolution counter having a known design being used, and the angle sensor and the revolution counter being disposed next to one another in a shared enclosure and/or on a shared printed circuit board.

9 Claims, 5 Drawing Sheets

(56) References Cited

U.S. PATENT DOCUMENTS

| | | |
|---|---|---|
| 10,859,404 B2 | 12/2020 | Diegel et al. |
| 2010/0232072 A1 | 9/2010 | Dimitrov et al. |
| 2020/0217907 A1 | 7/2020 | Raberg et al. |
| 2022/0308132 A1* | 9/2022 | Schmitt ................ G01R 33/072 |

FOREIGN PATENT DOCUMENTS

| | | |
|---|---|---|
| EP | 3 387 387 B1 | 10/2019 |
| WO | 2015/062573 A1 | 5/2015 |

* cited by examiner

MAGNETIC SYSTEM FOR COUNTING ROTATIONS HAVING INCREASED STABILITY AGAINST MAGNETIC INTERFERENCE FIELDS

Magnetic sensors can detect properties of a magnetic field, such as the field direction thereof. One example is an angle sensor. Other types of magnetic sensors can determine how often a magnetic field has rotated. Such revolution counters can be formed, for example, by a GMR revolution counter or a TMR revolution counter, such as are sufficiently known in the related art. In addition to the sensor function, such sensors generally also have a storage function, which is to say they store how often a permanent magnet, for example, has rotated. According to the prior art, the number of revolutions is usually determined in combination with an angle sensor, which determines the exact direction of the magnetic field. A measuring system, for example, which is to measure angles in a range of, for example, 0° to 3600°, can be composed of an angle sensor for determining the angle either between 0° and 180° (for example, using an anisotropic magnetoresistance (AMR) angle sensor) or between 0° and 360° (using a GMR or TMR angle sensor or a Hall sensor or another angle sensor) as well as a revolution counter, which makes it possible to ascertain the number of revolutions, in the example described above from 0 to 10. Both sensors, which is to say the angle sensor and the revolution counter, are designed as separately produced components and are, in general, disposed next to one another on a printed circuit board. Additionally, as mentioned, a component can be disposed on a printed circuit board, which includes evaluation electronics. This component can evaluate the signals of the two sensors, provide supply voltages, and also carry out error monitoring, such as is described in EP 3 387 387 B1, for example. A rotating permanent magnet can be provided above the angle sensor and the revolution counter, having a lateral extension that is established such that the stray magnetic field below the permanent magnet sufficiently encompasses the two aforementioned sensors. However, linear arrangements of magnets, which, for example, can operate as magnetic rulers, generate a rotating magnetic field when the revolution counter is moved past the magnetic ruler, which, with the aid of the revolution counter, can be used to implement a distance measurement.

The specific arrangement of the two components (angle sensor and revolution counter), which are simultaneously captured by the magnetic field of the permanent magnet, is influenced by the properties of the two components. The two components can, for example, be disposed next to one another on a printed circuit board. In this geometry, these experience the same magnetic flux B, which is generated by the permanent magnet in the plane of the components.

As will be explained below, arrangements in which the magnetic flux B at the location of the revolution counter is smaller than at the location of the angle sensor have advantages. This can be achieved, for example, by arranging the two components on opposite sides of a several millimeter thick printed circuit board. This increases the distance between the permanent magnet and the one component by the thickness of the printed circuit board. If the revolution counter is disposed below the printed circuit board, the magnetic flux B at the location of the revolution counter, due to the increased distance, is smaller than at the location of the angle sensor, which is exposed to the field B of the permanent magnet in closer proximity. Another possible arrangement, in which the B-field at the location of the revolution counter is smaller than at the location of the angle sensor, could be achieved by a magnetic shielding layer, which is disposed above the revolution counter. The two sensors could then be disposed on the same side of the printed circuit board. However, in such a case, the angle sensor and the revolution counter would have to be disposed at a greater distance since, otherwise, the shielding layer also undesirably reduces the B-field at the location of the angle sensor.

A magnetic angle sensor reaches the greatest accuracy thereof when high values of the magnetic flux B ($\geq 100$ mT), generated by the aforementioned permanent magnet, are present at the location of the sensor. In contrast, the revolution counter can only supply an error-free determination of the number of revolutions within a magnetic window, which can range, for example, from 15 mT to 30 mT. So as to be able to determine the angle by way of the angle sensor to within 0.05° or better, for example, a transducer magnetic field of at least 100 mT is required. For the revolution counter, in contrast, the transducer magnetic field must then only be 23% of this optimal value for the angle sensor, which is to say 23 mT, so as to be, itself, ideally, in the middle of the B-field range in which the revolution counter operates in an error-free manner.

As a result of the differing requirements with regard to the acting magnetic field for the two necessary components, the following disadvantages arise for the above-considered arrangements:

A geometrically neighboring arrangement of the two components on a printed circuit board without shielding layer does not allow a highly precise determination of the angle since the revolution counter typically establishes the B-field at the location of the angle sensor at 23 mT, otherwise the revolution counter could not operate in the pre-defined magnetic window thereof.

An arrangement on the two opposing sides of a thicker printed circuit board allows the two sensors to operate in the B-field range that is optimal for them. However, the thicknesses of the printed circuit board must be precisely matched to the transducer magnet and, for example, be modified when a permanent magnet having a different geometry is used (for example for a smaller measuring system). Integration of the two sensors in a chip housing is precluded in such a design when small sizes are specified.

Even though the use of a magnetic shielding layer, made of a homogeneous soft magnetic material, above the revolution counter, would allow the two sensors to be disposed on the same printed circuit board side and enable the respective operation thereof in the optimal B-field range, integration in a shared small chip housing would not be possible then, due to the distance that is required here between the angle sensor and the magnetic shield, which is situated above the revolution counter, since not only would such a shield have to laterally protrude beyond the revolution counter by approximately 60%, but would additionally have to be laterally spaced apart from the angle sensor on an order of magnitude of at least 50% of the lateral size of the magnetic shield for the action thereof on the revolution counter to remain substantially limited, and for the B-field at the location of the angle sensor to be only insignificantly influenced. In particular, the two arrangements, without the use of a shielding layer, have in common that the influence of magnetic interference fields acting from the outside on the sensor system has to be reduced to a sufficiently significant degree through suitable design measures. Such interference fields can arise, for example, when large fluxes are present in the vicinity of the sensor system. Other possibilities in which interference fields may occur involve the use of objects that include magnetic clamps in the vicinity of the sensor systems, such as illumination lamps.

For all applications, it must therefore be ensured through design measures with respect to the sensor system that, during the operation of the sensor system, the B-field acting on the revolution counter is always within the specified predefined range of the magnetic window.

This shall be illustrated based on the example in which, for example, a B-field from the transducer magnet in the range of 20 to 25 mT acts on the revolution counter under real conditions. This range is, for example, caused by the temperature dependence of the magnetization of the transducer magnet as well as by potential undesirable mechanical movements of the permanent magnet during operation, which slightly change the distance between the magnet and the plane in which the revolution counter is located. At a maximum permitted B-field of 30 mT, this means that the design of the overall system must be configured such that an interference magnetic field acting on the overall system at the location of the revolution sensor is always below 5 mT. If this cannot be ensured under the usage conditions of the sensor, this must be achieved through additional shielding measures. In general, this requires high design and material expenditures and is associated with considerable added costs.

The use of a soft magnetic shield at the location of the revolution counter for adapting the B-field at the location of the revolution counter to the magnetic window thereof improves the interference field immunity thereof. For this purpose, the magnetic shield, configured, for example, as a soft magnetic disk, would have to be disposed at a perpendicular distance of approximately 30% of the lateral extension of the sensor. At a lateral extension of the revolution counter of 2 mm, the shield itself would have to have a lateral extension of at least 4 mm and a thickness of 0.5 mm so as to ensure the B-field in the region of the revolution counter in accordance with the invention. Since the angle sensor must not be captured by the shield so as to achieve the high measurement accuracy thereof, the angle sensor would have to be spaced apart from the revolution counter by a minimum distance of approximately 6 mm, which renders impossible a close lateral arrangement of the two sensors or integration of the angle sensor, the revolution counter, and the evaluation electronics on a chip and in a shared housing of a customary design. At the same time, the permanent magnet would have to be designed larger laterally so that both sensors are in the homogeneous region of the B-field. Large permanent magnets, however, constitute a significant share of the costs of the overall sensor system. If the angle sensor and the revolution sensor could be successfully disposed closely together, smaller permanent magnets can be used, and consequently costs can be saved. If, additionally, it were possible to integrate at least the angle sensor and the revolution counter in one housing, this would lower the overall price compared to the use of sensors in separate housings. Moreover, this would save assembly costs.

A revolution counter, such as is described in DE 10 2008 063 226 A1, comprises a magnetic conductor in which magnetic domain walls move. This conductor may be part of a giant magnetoresistance (GMR) stack or of a tunneling magnetoresistance (TMR) stack and be produced in a spiral-like shape. The magnetic window of such a spiral can be set, for example, by the width of the soft magnetic structure in the stack. Narrower widths result in higher values for the lower and upper values of the magnetic window. For a revolution counter that is to operate at 100 mT, the structure widths would have to be reduced to ¼ of the structure width of approximately 350 nm used thus far. However, it is difficult to produce structures having structure widths of less than 100 nm instead of the typical 350 nm thus far. If lithography processes are used for structuring, there is a major risk of the yield of the components being drastically degraded due to the unavoidable roughness of the magnetic conductors.

It is the object of the invention to provide a magnetic system for counting revolutions having increased magnetic interference field immunity, which can be used in a magnetic field range (B-field range) that is considerably above that customarily used according to the prior art. Moreover, the width of the magnetic window ΔB, which is to say the difference between the lower and upper B-values permissible during use, is to be as large as possible.

The object is achieved by the characterizing features of claim 1. The essence of the invention is that a magnetic damping structure that automatically adapts the magnetic action thereof, except one made of a homogeneous soft magnetic material, is assigned to the revolution counter, the damping structure having no, or only a negligibly small, magnetic field of its own at an external magnetic field of zero. Advantageous embodiments are the subject matter of the dependent claims.

The following exemplary embodiments are provided for a more detailed description of the invention. In the drawings.

Figure 1:
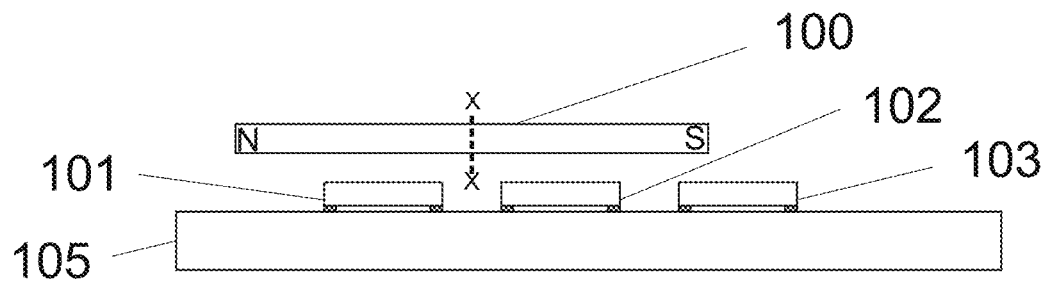
FIG. 1 shows a customary arrangement according to the prior art of an angle sensor and a revolution sensor.

FIG. 1 initially shows a basic design of a magnetic revolution counter, such as is customary according to the prior art, and which is also to be generally retained in the present invention. An angle sensor 101, a revolution counter 102 and a component comprising evaluation electronics 103 are disposed on a printed circuit board 105 by way of example. In the example, the angle sensor 101 and the revolution counter 102 are covered by a permanent magnet 100, which uniformly captures the two components 101 and 102 and can be rotated about the axis X-X, and are captured in the same manner by the magnetic B-field thereof.

Figure 2:
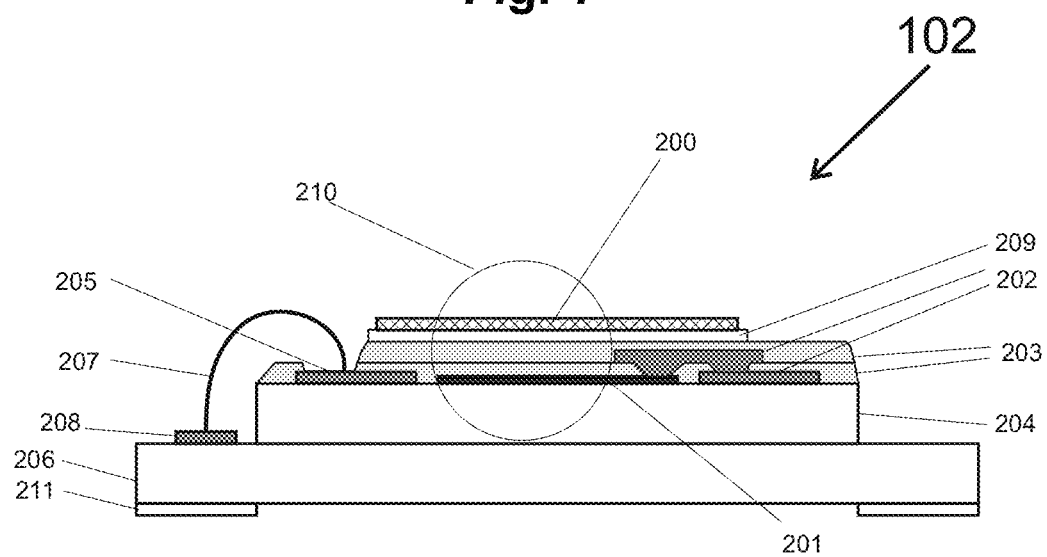
FIG. 2 shows a basic design according to the present invention.

FIG. 2 shows a basic design according to the present invention. Here, a smart magnetic damping structure 200, which is to say one that automatically adapts the magnetic action thereof, is internally integrated into and assigned to the revolution counter 102. FIG. 2 shows the position of the damping structure 200 within the revolution counter 102 in a first example. This revolution counter 102 according to the invention can then also be provided on a printed circuit board 105, directly next to the angle sensor 101. Both sensors are then captured, exactly as is shown in FIG. 1, by the magnetic field generated by the permanent magnet 100.

Figure 3:
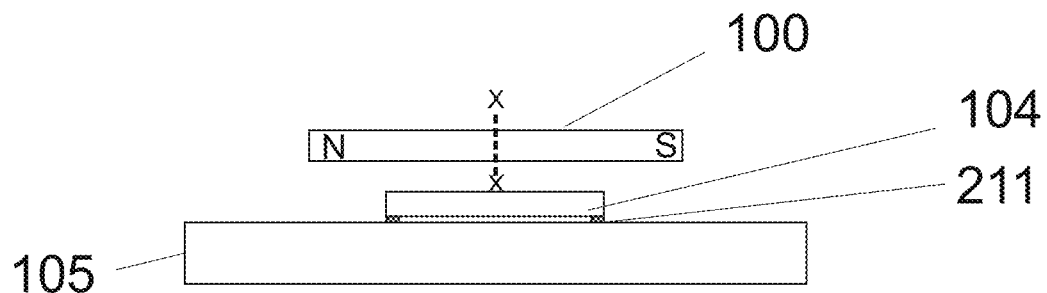
FIG. 3 shows an exemplary integration of an angle sensor, a revolution sensor, and possibly evaluation electronics in a chip.

A chip comprising evaluation electronics 103 can likewise be disposed on the printed circuit board 105. For cost reasons, it is highly advantageous when the angle sensor and the revolution counter, and possibly the evaluation electronics, are integrated in a chip 104 that includes all of the described components together, as is schematically shown in FIG. 3.

The action of the magnetic smart damping structure 200 makes it possible to considerably increase the magnetic window, for example from 15 mT to 30 mT, which has been customary to date (without use of the damping structure 200 according to the invention) to 60 mT to 120 mT when using the damping structure 200. In this example, the width of the magnetic window increases from 15 mT to 60 mT, which is to say by a factor of 4. The maximum permissible magnetic interference field can be 30 mT when the sensor is operated at 90 mT, and can thus be increased by approximately a factor of 6. This considerably simplifies the use of the revolution counter, since a separate magnetic shield, which is otherwise customary according to the prior art and not shown here, becomes simpler, or even entirely redundant. This saves costs and opens up new fields of application for the magnetic revolution counter. A considerable advantage of this solution according to the invention is that the novel damping structure 200 makes it possible to integrate the angle sensor 101 together with the revolution counter 102, and possibly also the evaluation electronics 103, in one chip 104. Such an integration option allows the use of a permanent magnet 100 that has decreased geometric dimensions. This, and the decrease in the assembly complexity, result in a less expensive solution than has been possible thus far according to the prior art.

Hereafter, the special design of the magnetic damping structure 200 according to the invention shall be described based on multiple specific examples. According to the invention, magnetic materials that, due to the intrinsic properties thereof, generate no, or only a very small B-field, of their own at an external magnetic field of B=0, and during the remagnetization of which no, or only minor, magnetic losses occur, are to be used in the damping structure 200.

Figure 4:
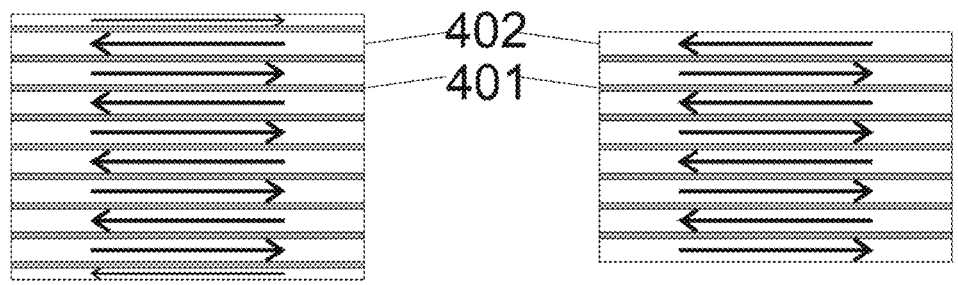
FIG. 4 shows a first possible embodiment of a magnetic damping structure used according to the invention.

As is shown in FIG. 4 for a first example with two possible arrangements, this can be achieved when the magnetic damping structure is composed of sub-layers 402, which are stacked on top of one another, magnetized in the plane, and in each case oriented anti-parallel, and the respective thickness of which is selected such that the layers compensate for one another magnetically. An anti-parallel orientation of the layers 402 arises when thin ferromagnetic layers 402 are separated by ultrathin layers 401 made of copper or ruthenium, for example. An anti-parallel orientation occurs, for example, when the thickness of Ru is between 0.8 nm and 1 nm, or that of Cu is approximately 1 nm or 2 nm. The B-field $B_{sat}$, which is required for complete parallel orientation of the magnetizations of the regions 402, depends on the thickness and the type of the non-magnetic intermediate layer 401 and on the material of the ferromagnetic layer 402 and the thickness thereof. For a 3 nm thick $Co_{90}Fe_{10}$ layer and 0.8 nm Ru, a $B_{sat}$ of approximately 900 mT is required. If the thickness of the individual layer is increased to the 10-fold value, which is to say 30 nm, the value of $B_{sat}$ decreases to $\frac{1}{10}$, which is to say, approximately 90 mT. By selecting the thickness of the individual ferromagnetic layers 402, it is thus possible to easily set the desired value of $B_{sat}$. The overall B-field, which can be generated by such a structure at the location of the soft magnetic conductor as an integral part of the GMR or TMR stack for guiding magnetic domains (refer to 201 in FIG. 2), depends on the overall thickness and the lateral extension thereof. For this reason, according to the invention, stacks of such arrangements as are shown by way of example in FIG. 4 are preferably used. If the thickness of the magnetic layers 402 in the entire layered stack is constant, the arrangement shown on the right in FIG. 4 is obtained.

Another possible arrangement within the scope of this exemplary embodiment is that shown on the left in FIG. 4, in which the upper and lower ferromagnetic layers 402 only have half the thickness of the other ferromagnetic layers. At B=0, and thus in a complete anti-parallel position of all individual magnetizations of the layers 402, the B-field of these layers which acts toward the outside is equal to zero in both configurations according to FIG. 4.

Figure 5:
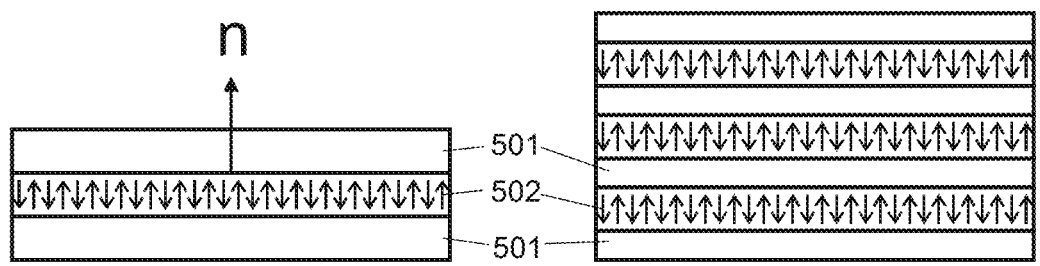
FIG. 5 shows a second possible embodiment of a magnetic damping structure used according to the invention.

Another embodiment according to the invention of a magnetic damping structure 200 is shown in FIG. 5. The example on the left shows a 3-layer stack, which is composed of a ferromagnetic layer 502, which is delimited by two non-ferromagnetic layers 501. If the material of the layer 501 is made of Pt, Pd, Ta or MgO, for example, a perpendicular magnetization of the layer 502 is energetically preferred. For reasons related to the magnetic stray field energy, neighboring regions become anti-parallel oriented in the direction of the normal n of the layer plane. In the case of an external magnetic field of B=0, a layer structure thus arises again which does not generate a B-field of its own. For a 1.5 nm thick $Fe_{60}Co_{20}B_{20}$ layer that is enveloped in MgO, the saturation field during the exposure to a magnetic field in the layer plane has values of up to 500 mT. The B-field, which is generated by a 1.5 nm thick $Fe_{60}Co_{20}B_{20}$ layer that is oriented in the plane, is usually too small for the application. This is why a large number of magnetic layers 502, which are each separated by non-ferromagnetic layers 501, must be disposed on top of one another, as is shown by way of example on the right in FIG. 5.

Figure 6:
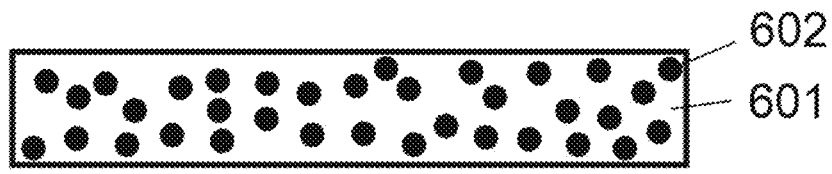
FIG. 6 shows a third possible embodiment of a magnetic damping structure used according to the invention.

FIG. 6 shows third possible embodiment according to the invention of a magnetic damping structure 200. An accumulation of small superparamagnetic particles 602, each having a superparamagnetic moment and being oriented in a disordered manner and embedded in a non-magnetic matrix 601, is schematically illustrated here. At an external magnetic field of B=0, such a layer structure has no net magnetic moment. The particles 602 used can be, for example, magnetite particles having a diameter of 10 nm to 20 nm. When a magnetic B-field is applied in the layer plane, the net magnetization in the immediate vicinity increases linearly with the B-field and, at $B_{sat}$, again reaches the state at which all particles have the same magnetic orientation in the plane. Typical saturation fields of such a structure at room temperature are 250 mT.

According to the above exemplary embodiments, the configurations made of sub-regions that are oriented in a magnetically anti-parallel or magnetically disordered manner thus have in common that these generate no, or only a negligibly small, dedicated B-field of their own at an external magnetic field of B=0. So as to magnetize all magnetic sub-regions of a laterally extensive structure, such as is provided for the magnetic damping structure 200, in a direction, for example in the plane, a saturation magnetic field $B_{sat}$ is required.

Figure 8:
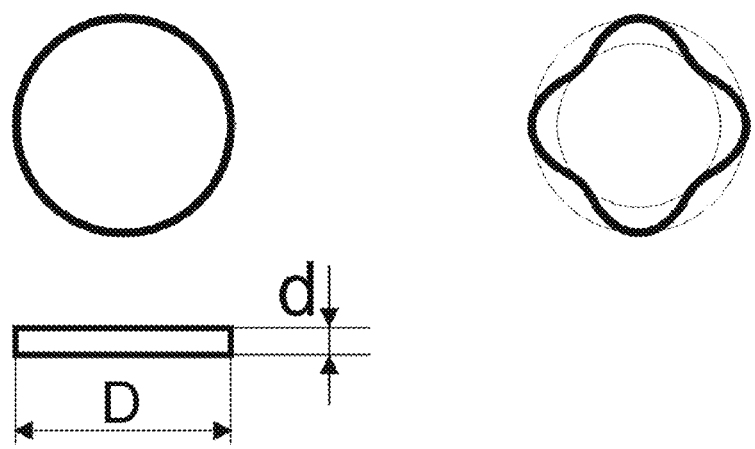
FIG. 8 shows, by way of example, two different geometric configurations of the magnetic damping structure in a top view and in a cross-sectional view.

If the above-described damping structures are brought into a defined geometric shape, such as a disk having a thickness d and a diameter D (refer to FIG. 8), this disk generates a stray magnetic field and has stray field energy when a magnetic field is applied. This stray field energy, in turn, influences the magnetization and can be described using magnetic shape anisotropy. So as to overcome this stray field energy, a field $B^{SH}_{sat}$ is required for complete orientation in the direction of the magnetic field. The saturation field strength $B^{SH}_{sat}$ is determined by the ratio of the lateral extension of the disk to the overall thickness of the magnetic layer(s) and the value of the saturation magnetization of the ferromagnetic material.

If the magnetic layer is made of a layer stack, as is described above in one of the aforementioned options, the two above-described effects are additively superimposed. This means that a larger B-field B res has to be applied in the plane to homogeneously orient all magnetic regions (402 or 502 or 602) in the plane. The field that is required for this purpose results from the addition of the individual values for $B^{SH}_{sat}$ as well as for $B_{sat}$ according to the following equation: $B^{res}_{sat} = B^{SH}_{sat} + B_{sat}$.

If a circular disk having a thickness of, for example, 20 m and a diameter of 1000 μm, made of a layer stack of 15 nm CoFe/0.8 nmRu/ [30 nm CoFe/0.8 nm Ru]$_{40}$/15 nm CoFe, is used for the magnetic damping structure 200 according to the invention, then $B^{SH}_{sat}=35$ mT and $B_{sat}=90$ mT. $B^{res}_{sat}$, as the sum of $B^{SH}_{sat}$ and $B_{sat}$, is thus 125 mT.

Figure 7:
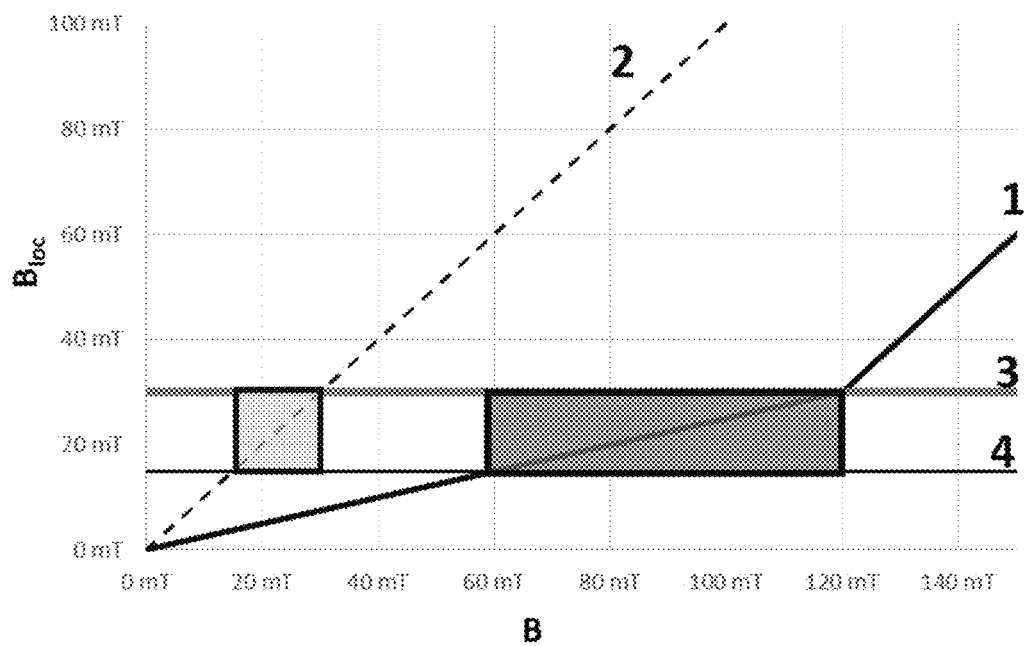
FIG. 7 shows an exemplary representation of the action of a magnetic damping structure according to the invention.

Hereafter, the action of a smart magnetic damping structure 200, which is designed as a disk and exposed to a homogeneous B-field, shall be described based on FIG. 7. On the y axis, the values for $B_{min}$ and $B_{max}$ of a revolution counter 102 are plotted with horizontal lines. If this disk 200 is introduced into an external magnetic field such that the B-field is oriented parallel to the disk surface, the B-field is unchanged at a large distance from the disk (dotted line in FIG. 7, marked with "2"). Directly above or below the disk, in the center of the disk, a B-field is obtained as shown with the thick black line, marked with "1." As long as the disk 200 is not magnetically saturated, which is to say for $B<B^{res}_{sat}$, the B-field increases linearly at this point, but much more slowly than the B-field acting from the outside. The thick line "1" thus only intersects the two lines for $B_{min}$ "4" and $B_{max}$ "3" of the revolution counter at much larger B-values. As a result, the magnetic window is increased from originally 20 mT to 40 mT to a magnetic B-window of 60 mT to 120 mT. This means that a window that is three times wider is available for use for the revolution sensor. With this, the stability against external or interference fields also improves, which likewise entails major advantages for application.

For the case of the circular design of the damping structure 200 described here (corresponding to the left in FIG. 8), the magnetic behavior of the disk is the same in all directions in the plane, which is to say that the B-field acting above and below the damping structure is identical, in absolute terms, for all directions of the B-field in the plane. This is the desired behavior for the spiral-shaped revolution counter, as it is known from DE10 2008 063 226 A1.

The case is different when so-called closed loop structures are used, such as are described in the patent EP 3 066 421 B1, for example. This geometry utilizes a spiral having the two ends thereof connected to one another. As a result, intersections of the magnetic conductors are created. At the intersections, the width of the magnetic conductor in the direction of the diagonal of the intersection is increased by approximately 45%. As a result, the magnetic window in the 0° direction differs from the magnetic window in the 45° direction. Such differences can be compensated for when the damping structure is no longer circular, but has a shape as shown on the right in FIG. 8. According to the invention, for the damping structure for a revolution counter which operates based on a closed loop structure (EP 3 066 421 B1), it is therefore provided to no longer design the damping structure in a circular manner, but, as is shown on the right in FIG. 8, modifying this in selected directions. In this way, differences with respect to the B-field can be easily adapted in different directions by way of the selection of the geometry of the damping disks, at which the lateral extension is different in different directions. If the diameter of the disk is increased in one direction by 20%, the value of $B^{SH}_{sat}$ in this direction is reduced by 20%. As an example, reference shall be made to the two-fold geometry of the smart damping disk on the right in FIG. 8. On the left in FIG. 8, $B^{SH}_{sat}$ is identical in all directions, which is to say the magnetic behavior is isotropic. In the geometry shown on the right in FIG. 8, the saturation field $B^{SH}_{sat}$ is identical in the X and Y directions, but different from the saturation field $B^{SH}_{sat}$ present in +/−45°.

Figure 9:
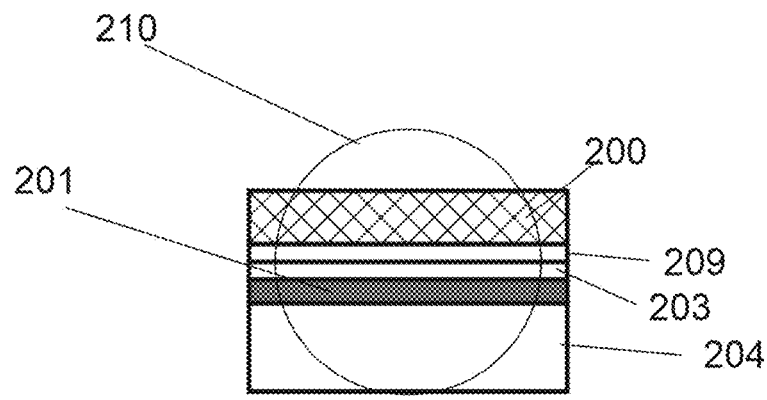
FIG. 9 shows an exemplary arrangement of the damping structure above the magnetically sensitive part of the revolution counter.
Figure 10:
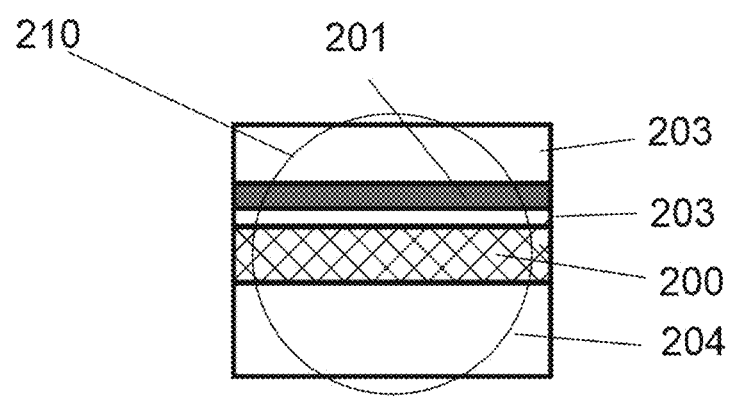
FIG. 10 shows an exemplary arrangement of the damping structure below the magnetically sensitive part of the revolution counter.

The arrangement of the damping structure 200 directly in relation to the magnetically sensitive part 201 of the revolution counter is explained by way of example in FIGS. 2, 9 and 10. FIG. 2 schematically shows a cross-section of a revolution counter chip. The silicon substrate 204 on which the functional part of the revolution counter is situated is adhesively attached to the base plate of the housing 206 of the revolution counter. The electrical connection of the bond pad structures 205 of the revolution counter applied to the Si substrate 204 is implemented by way of bonding wires 207, connecting the bond pads 205 present on the Si substrate 204 to the bond pads 208 of the housing. The solder contacts 211 are utilized for soldering the chip onto a printed circuit board 105 (refer to FIG. 3). The structures applied to the Si substrate include the functional structure 201 of the revolution counter, the metallization structures 202, and the bond pads 205. These structures are at least partially covered by an insulating layer 203. The damping layer 200 according to the invention is only applied in a sub-region of the Si substrate and completely covers the structure 201 relevant for the function of the revolution counter, with a small lateral protrusion. The overall lateral extension thereof can therefore be smaller than the surface area of the Si substrate 204. An insulating layer 209 likewise acting as a planarization layer can be present beneath the damping layer 200.

The position of the damping structure 200 can, as is illustrated in FIGS. 9 and 10 (circular detail 210 from FIG. 2), be disposed both above and below the structure 201. This is related to the fact that the B-field generated by the damping structure 200 is substantially identical above and below the damping structure 200 since the geometric distance between these two positions is small compared to the distance with respect to the permanent magnet. As is stated below, the insulating layers are only a few micrometers thick, the GMR or TMR layer is only approximately 70 nm, and the distance 201 with respect to 100 always has the minimum size of 1 mm.

Proceeding from FIG. 2, it is apparent that the damping layer has a lateral size that is below the space requirement that exists for the bond pads in any case. Since the thickness of the insulating and intermediate layers 203 and 209 is only in the range of a few micrometers, the damping structure also has to protrude laterally beyond the magnetically sensitive structure 201 of the revolution counter by only a few micrometers to a few tens of micrometers to sufficiently minimize the influence of the effects, which only occur at the ends of the damping structure. In general, the damping layer 200, in the lateral extension, not laterally protruding beyond the soft magnetic GM R or TMR structures 201 of the revolution counter 102 by more than 30% applies to all exemplary embodiments according to the invention. It is therefore evident that the new design does not exceed the space requirement of existing designs, and it is now even possible, if the angle sensor and the revolution counter are not separately encapsulated, to dispose the two sensors, as a result of being jointly encapsulated, in an even more closely neighboring manner (distance<200 μm) since the extension of the damping structure 200, as shown in FIG. 2, is considerably smaller than the revolution counter 102. Without a shared encapsulation, a revolution counter can likewise be disposed in a closely neighboring manner (distance<200 μm) with respect to an angle sensor, without losing the above-described advantages. From this, it follows that, due to the closely neighboring arrangement of the revolution counter 102 with respect to the angle sensor 101, similarly to shared encapsulation of the two parts in a shared housing, a smaller permanent magnet 100 is made possible, which in turn brings with it a considerably smaller overall system and reduced costs for the permanent magnet.

The technology for producing the damping layer 200 for the systems shown in FIGS. 4 and 5 is possible by way of a sputtering process and can thus be carried out in the same manufacturing process as the production of the revolution counter itself.

As a result of the described damping structure 200, considerably improved immunity to interference fields of the magnetic revolution counter can be achieved, whereby the costs during use can be reduced, in particular for magnetic shields that otherwise become necessary, or these may even be entirely dispensed with.

Figure 11:
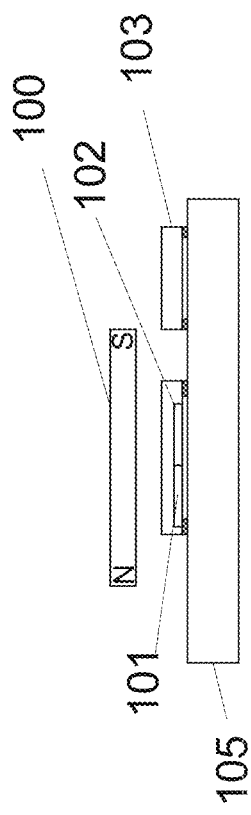
FIG. 11 shows an exemplary arrangement of the angle sensor and the revolution counter on a circuit board, together with the evaluation electronics.
Figure 12:
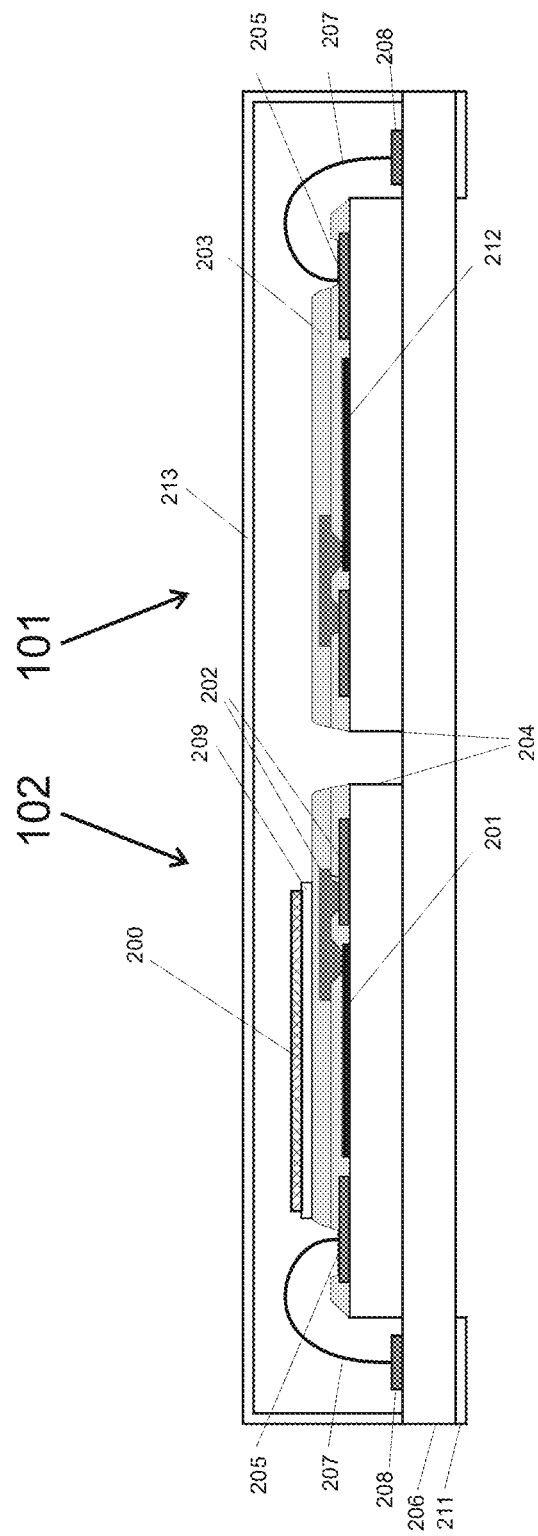
FIG. 12 shows an exemplary arrangement of the angle sensor and the revolution counter in a shared housing.

Additionally, due to the limited lateral extension of the damping layer, the described solution allows the integration of the angle sensor and the revolution counter, as shown in FIGS. 11 and 12, and possibly also of the evaluation electronics (as shown in FIG. 3), in a shared hermetically sealed enclosure 213 that encompasses all components jointly. By virtue of the present invention, it is possible to establish the distance between the angle sensor 101 and the revolution counter 102 at an order of magnitude of less than 500 μm. A commercially available chip housing can be used for the enclosure 213. This reduces the design complexity of the overall system, allows more compact solutions, and thus saves considerable costs. As a result of the invention, it is also possible to use smaller permanent magnets 100, which further lowers the costs for the overall system. Likewise, the magnetic window of the revolution counter 102, which is widened by the present invention, results in lower tolerance requirements with regard to the permanent magnets 100.

LIST OF REFERENCE NUMERALS

100 permanent magnet
101 angle sensor
102 revolution counter
103 evaluation electronics
104 chip comprising angle sensor and revolution counter
105 printed circuit board
200 damping structure
201 soft magnetic conductor as an integral part of the GMR or TMR stack for guiding magnetic domains
202 metallization
203 insulating intermediate layer
204 silicon substrate
205 contact including contact opening
206 chip lower part (housing)
207 bonding wire
208 contact pad in the chip housing
209 planarization layer
210 marked circle (for later illustrations in FIGS. 9 and 10)
211 SMD bond pad
212 soft magnetic conductor as an integral part of the GMR or TMR angle sensor
213 enclosure
401 non-ferromagnetic thin layer
402 ferromagnetic thin layer
501 layer generating the perpendicular magnetic anisotropy of the layer 502
502 ferromagnetic thin layer
601 non-magnetic matrix
602 (superpara)magnetic particles

The invention claimed is:

1. A magnetic system for counting revolutions having increased magnetic interference field immunity, comprising an angle sensor configured to determine a field direction of a magnetic field of a permanent magnet which jointly captures the angle sensor and a revolution counter, the revolution counter being formed by a GMR or TMR revolution counter, and the angle sensor and the revolution counter being disposed next to one another in a shared enclosure and/or on a shared printed circuit board, wherein a magnetic damping structure not made of a homogeneous soft magnetic material and configured to adapt magnetic action thereof is assigned to the revolution counter, the damping structure having no, or only a negligibly small, magnetic field of its own at an external magnetic field of zero, and wherein the damping structure comprises a plurality of regions oriented in a magnetically anti-parallel configuration or in a magnetically disordered configuration.

2. The magnetic system according to claim 1, wherein the damping structure comprises a damping layer which does not laterally protrude beyond the soft magnetic GMR or TMR structures of the revolution counter by more than 30%.

3. The magnetic system according to claim 2, wherein the damping layer comprises ferromagnetic sub-layers, which are stacked on top of one another, magnetized in a plane thereof, and in each case oriented anti-parallel, the respective thickness of which being selected such that these compensate for one another magnetically, the sub-layers being separated by non-ferromagnetic thin films.

4. The magnetic system according to claim 2, wherein the damping layer is formed of a layer stack comprising at least one ferromagnetic layer which is captured on each side by a respective non-ferromagnetic layer, the ferromagnetic layer having a perpendicular magnetization parallel to a normal of the ferromagnetic layer, and neighboring magnetic field regions taking on an anti-parallel direction.

5. The magnetic system according to claim 2, wherein the damping layer is formed of a layer system comprising an accumulation of small superparamagnetic particles each having a superparamagnetic moment and being oriented in a disordered manner and embedded in a non-magnetic matrix.

6. The magnetic system according to claim 2, wherein the damping layer is provided above or below the soft magnetic GMR or TMR structures of the revolution counter.

7. The magnetic system according to claim 2, wherein, depending on characteristics of the revolution counter with the damping layer, a geometry deviating from a circular shape, in a top view, is selected so as to take an effect of shape anisotropy into consideration.

8. The magnetic system according to claim 1, wherein a distance between the angle sensor and the revolution counter is less than 500 µm, and at least these two components are enclosed in a hermetically sealed manner by the shared enclosure.

9. The magnetic system according to claim 1, wherein a distance between the angle sensor and the revolution counter is less than 500 µm, and at least these two components, together with evaluation electronics, are enclosed in a hermetically sealed manner by the shared enclosure.

\* \* \* \* \*